(12) United States Patent
Kumaki

(10) Patent No.: US 7,502,708 B2
(45) Date of Patent: Mar. 10, 2009

(54) TEST APPARATUS, AND CONTROL METHOD

(75) Inventor: Norio Kumaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 60 days.

(21) Appl. No.: 11/546,929

(22) Filed: Oct. 12, 2006

(65) Prior Publication Data

US 2008/0091377 A1 Apr. 17, 2008

(51) Int. Cl.
*G06F 19/00* (2006.01)

(52) U.S. Cl. ..................................... 702/123

(58) Field of Classification Search ............... 702/123; 371/27.1, 27.2
See application file for complete search history.

(56) References Cited

U.S. PATENT DOCUMENTS 4,691,316 A * 9/1987 Phillips ....................... 714/29
5,930,271 A * 7/1999 Takahashi .................... 714/738
6,064,948 A * 5/2000 West et al. ................... 702/119

FOREIGN PATENT DOCUMENTS

JP 64-047148 U 3/1989
JP 11-64450 3/1999
JP 2004-163351 A 6/2004

OTHER PUBLICATIONS

Boot definition, http://www.linfo.org/boot.html, p. 1-3, Jan. 23, 2006.*
International Search Report issued in International Application No. PCT/JP2007/067764 mailed on Dec. 18, 2007, 9 pages.

* cited by examiner

*Primary Examiner*—Tung S Lau
(74) *Attorney, Agent, or Firm*—Osha • Liang LLP

(57) ABSTRACT

A test apparatus that tests a device under test is provided. The test apparatus includes: a control processor that executes a test program to test the device under test; a test unit connected to the device under test that tests the device under test according to an instruction by the control processor; and a relay section connected to the control processor and the test unit that relays a control instruction transmitted from the control processor to the test unit. The relay section includes: a buffer section that buffers the control instruction to be written to the address assigned from the control processor to the test unit; a timing storage section that stores a timing at which the control instruction received from the control processor should be transmitted to the test unit; and a buffer control unit that transmits the control instruction buffered in the buffer section to the test unit in response to that the timing stored in the timing storage section comes.

4 Claims, 10 Drawing Sheets

TEST APPARATUS, AND CONTROL METHOD

BACKGROUND

1. Field of the Invention

The present invention relates to a test apparatus and a control method. Particularly, the present invention relates to a test apparatus and a control method for causing a control processor to transmit a control instruction to a test unit to control the test unit for testing a device under test.

2. Related Art

A control processor provided in a test apparatus operates based on a control program installed and transmits an instruction to a test unit. Thereby it enables to control the test unit to appropriately activate and to change the setting of the test unit in operation.

However, for the test unit, the order of instructions to be processed is determined based on the specification thereof. If the order of executing the instructions does not meet the specification, the test unit and the device under test might be damaged.

Additionally, for the test unit, the timing to be executed based on the specification thereof. For example, the next instruction should be executed after a predetermined waiting period when the voltage is changed, otherwise the test unit might not normally operate due to an unstable voltage. Therefore, the programmer appropriately inserts instructions to wait for a predetermined period without executing any instruction into the program.

The instructions to wait for a predetermined period can be enabled by setting an stand-by time to a timer outside of a control processor and generating to interrupt the control processor from the timer. Additionally, the instructions to wait for a predetermined period can be enabled by executing an idle loop which does not basically need in the control program and executing a stand-by by a function of an operating system for controlling the control processor.

However, a time for which the processor waits may be different from the time expected by the programmer because the timing of each instruction is different from each other.

For example, when the control processor receives executes various interrupts and thereby executes the other process, or time-shares a plurality of tasks and executes the same, the timing of the instruction might be delayed. Then, if the timing of the instruction is accelerated because of the difference of the timing of the execution, the next process is executed without holding a sufficient stand-by time, so that the test unit might be damaged.

In order to avoid the above-described disadvantage, the programmer creates the control program so as to hold a stand-by time sufficiently longer than the actually required stand-by time. Therefore, the time required for setting is significantly longer than the actually required time, so that the effect of the whole of the test processing could have been reduced.

Here, refer Japanese Patent Application Publication No. 11-64450 as a related art regarding a semiconductor test apparatus.

SUMMARY

Therefore, it is an advantage of some aspects of the invention to provide a threshold voltage control apparatus, a test apparatus and a circuit device that can solve the foregoing problems. The above and other objects can be achieved by combinations described in the independent claims. The dependent claims define further advantageous and exemplary combinations of the present invention. The above and other advantages can be achieved by combinations described in the independent claims. The dependent claims define further advantageous and exemplary combinations of the present invention.

A first aspect of the present invention provides a test apparatus that tests a device under test. The test apparatus includes: a control processor that executes a test program to test the device under test; a test unit connected to the device under test that tests the device under test according to an instruction of the control processor; and a relay section connected to the control processor and the test unit that relays a control instruction transmitted from the control processor to the test unit. The relay section includes: a buffer section that buffers the control instruction to be written to an address assigned from the control processor to the test unit; a timing storage section that stores a timing at which the control instruction received from the control processor should be transmitted to the test unit; and a buffer control unit that transmits the control instruction buffered by the buffer section to the test unit in response to that the timing stored in the timing storage section comes.

The control processor writes the timing at which the control instruction should be transmitted to the test unit to the address assigned to the relay section before writing the control instruction. The buffer section sequentially buffers a timing write command for writing a timing and a control instruction write command for writing the control instruction, which are received from the control processor. The buffer control unit may delay processing the control instruction write command received after the timing write command until the timing comes in response to that the timing write command is fetched from the buffer section.

The buffer control unit may includes: a fetch section that sequentially fetches the write commands buffered in the buffer section; a timing write section that causes the timing storage section to store the timing in response to that the timing write command is fetched; a detecting section that detects to come the timing stored in the timing storage section; and a transmission section that transmits the control instruction write command received after the timing write command provided that a coming of the timing is detected.

The test apparatus is to test a plurality of device under tests. A plurality of test units may be provided for each of the plurality of device under tests. Additionally, a plurality of relay sections may be provided for each of the plurality of test units.

Another aspect of the present invention provides a control method of controlling a test apparatus including a control processor that executes a test program to test a device under test and a test unit connected to the device under test that tests the device under test according to an instruction of the control processor. The method includes the steps of: buffering a control instruction to be written to an address assigned from the control processor to the test unit; storing a timing at which the control instruction received from the control processor should be transmitted to the test unit; and transmitting the buffered control instruction to the test unit in response to that the timing comes.

The summary of the invention does not necessarily describe all necessary features of the present invention. The present invention may also be a sub-combination of the features described above.

DESCRIPTION OF EXEMPLARY EMBODIMENTS

Aspects of the invention will now be described based on the preferred embodiments, which do not intend to limit the scope of the present invention, but exemplify the invention. All of the features and the combinations thereof described in the embodiment are not necessarily essential to the invention.

Figure 1:
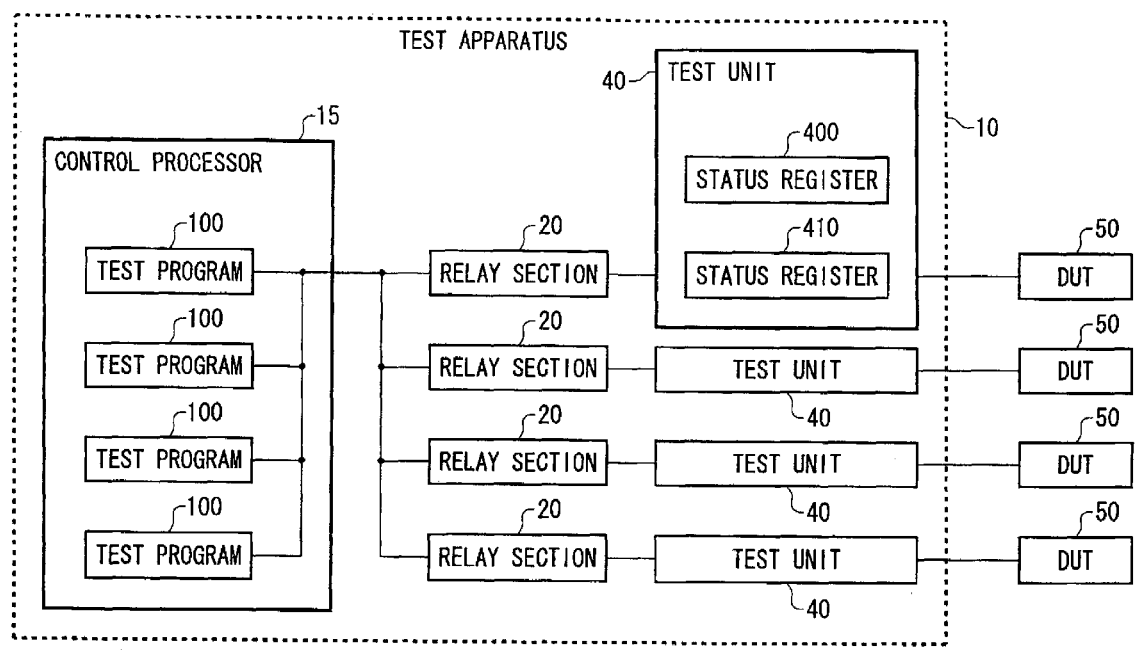
FIG. 1 shows a whole configuration of a test apparatus 10.

FIG. 1 shows a whole configuration of a test apparatus 10. The test apparatus 10 includes a control processor 15, a plurality of relay sections 20 and a plurality of test units 40. The control processor 15 executes a test program 100 that tests a device under test. The test processor 15 may execute a plurality of test programs 100 each of which controls different test unit 40.

Each of the plurality of test programs 100 may be executed in parallel by time-sharing a computer resource in an operating system which includes an executive mechanism referred to as a multi-task, a multi-process or a multi-thread.

Each of the plurality of test units 10 is provided for each of the plurality of device under tests. Each of the plurality of test units 40 includes a status register that indicates the status of the test unit 40. For example, each of the plurality of test units 40 has a status register 400 being an example of a first status register and a status register 410 being an example of a second status register. As for FIG. 1, the status registers 400 and 410 are shown in only one test unit 40. However, each of the other test units 40 may have the status unit.

Then, each of the plurality of test units 40 reflects the status thereof on each corresponding status register according to the change of state accompanied by the progress of the test.

Each of the plurality of relay sections 20 is provided for each of the plurality of test units 40. Each of the plurality of relay sections 20 is connected to the control processor 15 and the corresponding test unit 40. Then, each of the plurality of relay sections 20 relays a control instruction transmitted from the control processor 15 to the test unit 40. Specifically, the storage area in the relay section 20 and the storage area in the test unit 40 are mapped onto a virtual address space on which the test program 100 is executed by the control processor 15.

Then the control processor 15 executes a write command in the test program 100 to write to the virtual address space, i.e. the relay section 20 and the test unit 40. Here, the control instruction to the test unit 40 may be an instruction to set/change the magnitude of voltage applied from the test unit 40 to the device under test, an instruction to set/change the frequency of a test signal and an instruction to start an operation of a test sequence.

The relay section 20 receives the write data for the address space assigned to test unit 40 and directly transmits the same to the test unit 40. While the relay section 20 writes the write data for the address space assigned by the relay section 20 to a register or a memory in the relay section 20 dependent on the content. The relay section 20 controls the timing at which the instruction is transferred dependent on the content written. For example, the relay section 20 may transmit the data such as the control instruction received following the write data after waiting for a time indicated by the write data.

As described above, the test apparatus according to the present embodiment controls the timing at which a command is transmitted to the test unit 40 by the relay section 20 which is provided independent of the control processor 15. Thereby it is intended to reduce the processing load of the control processor 15 and accurately control the timing at which the control instruction is transmitted.

Next, the functional configuration of one relay section 20 among the plurality of relay sections 20 will be described.

Figure 2:
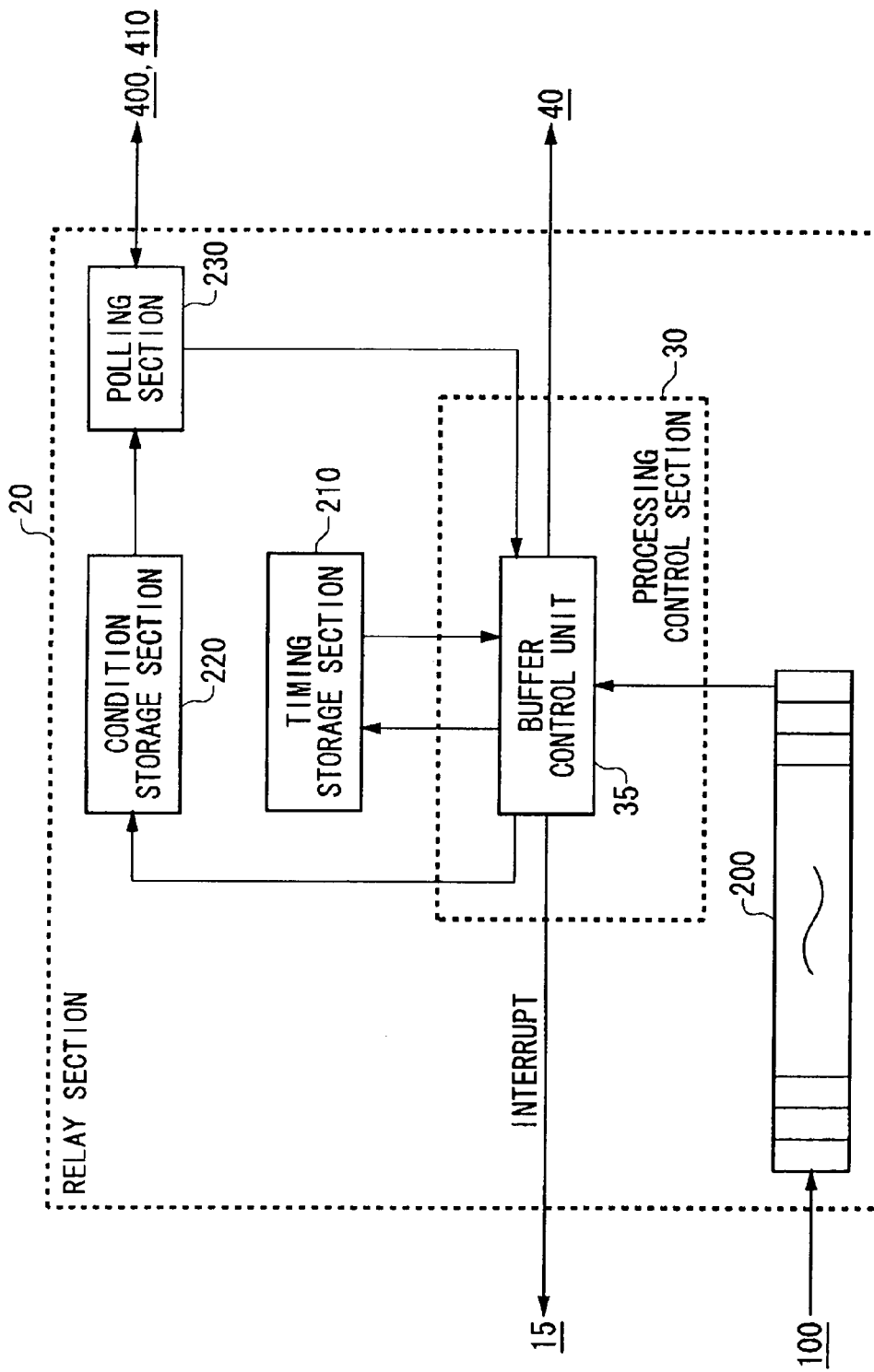
FIG. 2 shows a functional configuration of a relay section 20.

FIG. 2 shows a functional configuration of the relay section 20. The relay section 20 includes a processing control section 30, a buffer section 200, a timing storage section 210, a condition storage section 220 and a polling section 230. As an example of implementation, the buffer section 200, the timing storage section 210 and a condition storage section 220 are implemented by means of a recording medium such as a register and a memory, and the polling section 230 and the processing control section 20 are implemented by a sequencer. Firstly, it will be described about a processing function in the case that the control processor 15 writes a timing at which a control instruction should be transmitted to the test unit 40 before writing the control instruction to an address assigned to the test unit 40. The buffer section 200 sequentially buffers a timing value to be written from the control processor 15 to the address assigned to the relay section 20 and a control instruction to be written from the control processor 15 to the address assigned to the corresponding test unit 40.

Specifically, the buffer section 200 sequentially buffers the timing write command to write the timing value and the control instruction write command to write the control instruction, which are received from the control processor 15. The timing command is a set of an address in the address space assigned to the relay section 20 and a timing value to be written to the address, for example. Meanwhile, the control instruction write command is a set of an address in the address space assigned to the test unit 40 and a control instruction to be written to the address.

The timing storage section 210 stores the timing at which the control instruction should be transmitted to the test unit 40, which is received from the control processor 15. The timing will be stored by the buffer control unit 35 as a timing value according to the timing write command. The processing control section 30 includes a buffer control unit 35. The buffer control unit 35 controls to store the timing value and controls a transmission timing of the control instruction received following the timing write command. Specifically, the buffer control unit 35 transmits the control instruction buffered in the buffer section 200 in response to that the timing stored in the timing storage section 210 comes to the corresponding test unit 40. The timing value is such as an amount of delay which delays transmitting the control instruction received subsequently. That is to say, the buffer control unit 35 delays processing the control instruction write command received after the timing write command until the timing comes in response to fetching the timing write command from the buffer section 200.

Next, it will be described about a processing function in the case that after writing the address of the status register in the address space, which is assigned to the test unit 40 and the expected value to the address assigned to the relay section 20, the control processor 15 writes the control instruction to the address assigned to the test unit 40. The condition storage section 220 stores the address of the status register indicative of the status of the test unit 40, which is received from the control processor 15 and an expected value compared with the value of the status register. Those address and expected value will be stored in the buffer control unit 35. That is, acquiring the address of the status register and the status write command to write the expected value from the buffer 200, the buffer control unit 35 stores the address and the expected value on the condition storage section 220.

Here, the address of the status register may be a virtual address of the control processor 15, which is assigned to the status register and also may be the other identification information.

The polling section 230 repeatedly reads the status registers which are designated by the control processor 15. Here, the polling section 230 reads one or both of the status register 400 and the status register 410 according to the designation by the control processor 15. Specifically, the polling section 230 repeatedly issues read commands with the address of the status register (i.e. the address stored on the condition storage section 220) as a read address in response to that the condition write command is acquired from the buffer section 200. In response to that the value of the status register read out becomes the expected value designated by the control processor 15, the processing control section 30 transmits the control instruction to be processed by the test unit 40 after the value of the status register becomes the expected value. The control instruction to be processed after the value of the status register becomes the expected value is an instruction written by the control instruction write command which is received after the condition write command. That is, the buffer control section 35 transmits the control instruction write command received after the condition write command in response to that the value of the status register becomes the expected value.

Instead of or in addition to that, the buffer control unit 35 may issue an interrupt to the control processor in order to cause the control processor to transmit the subsequent control instructions in response to that the value of the status register becomes the expected value. That process has a beneficial effect on the case that a series of test processes is terminated. That is, for example, the buffer control unit 35 can start the next test from the top by issuing the interrupt to the control processor 15 to restart the control processor 15.

Figure 3:
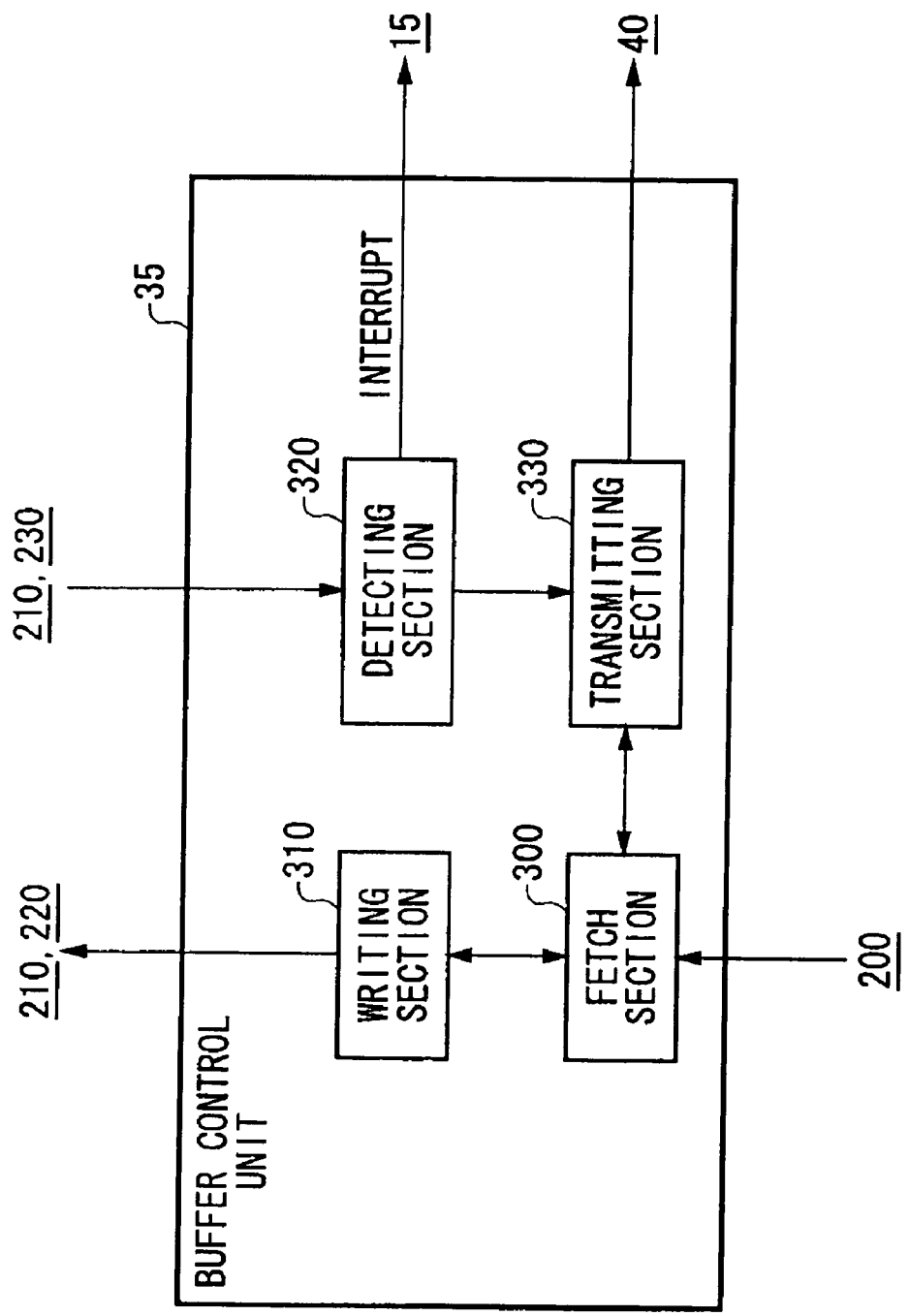
FIG. 3 shows a functional configuration of a buffer control unit 35.

FIG. 3 shows a functional configuration of the buffer control unit 35. The buffer control unit 35 includes a fetch section 300, a writing section 310, a detecting section 320 and a transmitting section 330. The fetch section 300 sequentially fetches write commands buffered in the buffer section 200. The fetch section 300 may fetch one write command from the head of the FIFO buffer section 200 in response to an notification that the writing is completed by the writing section 310 or an notification that the transmitting is completed by the transmitting section 330. Additionally, the fetch section 300 may delete the write command from the buffer section 200 immediately after the write command for the relay section 20 is fetched, and also may delete the write command from the buffer section 200 after the processing responsive to the write command is completed.

The writing section 310 is an example of timing writing section according to the present embodiment. The writing section 310 causes the timing storage section 210 to store the timing in response to that the timing write command is fetched. Additionally, the writing section 310 causes the condition storage section 220 to store the address and the expected value of the status register in response to that the condition write command is fetched. The detecting section 320 detects to come the timing stored in the timing storage section 210. Additionally, the detecting section 320 detects whether the value of the status register read by the polling section 230 becomes the expected value. The transmitting section 330 transmits the control instruction write command received after the timing write command to the test unit 40 provided that a coming of the timing is detected. Additionally, the transmitting section 330 transmits the control instruction write command received after the condition write command to the test unit 40 provided that the value of the status register becomes the expected value.

Figure 4:
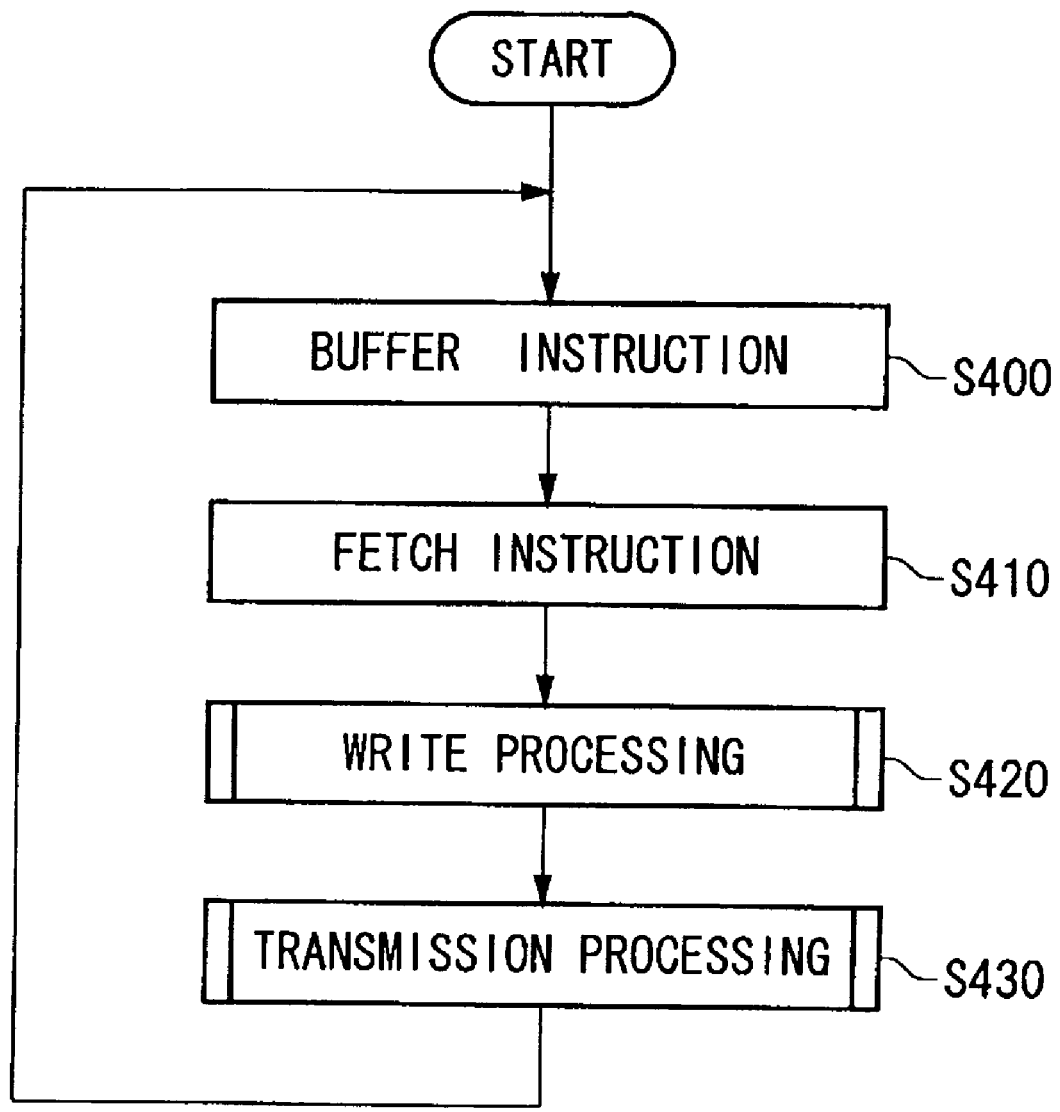
FIG. 4 is a flow chart showing a processing to relay an instruction from a control processor 15 to a test unit 40.

FIG. 4 is a flow chart showing a processing to relay an instruction from a control processor 15 to a test unit 40. The buffer section 200 buffers the control instruction to be written to the address assigned from the control processor 15 to the test unit 40 or the relay section 40 (S400). The fetch section 300 sequentially fetches the write command buffered by the buffer section 200. If the fetched command is the write command for the address space assigned to the relay section 20, the relay section 20 writes to the timing storage section 210 and the condition storage section 220 (S420). Meanwhile, if the fetched command is the write commands for the addresses of the status registers 400 and 410 of the test unit 40, the relay section 20 transmits the control instruction (S430).

Figure 5:
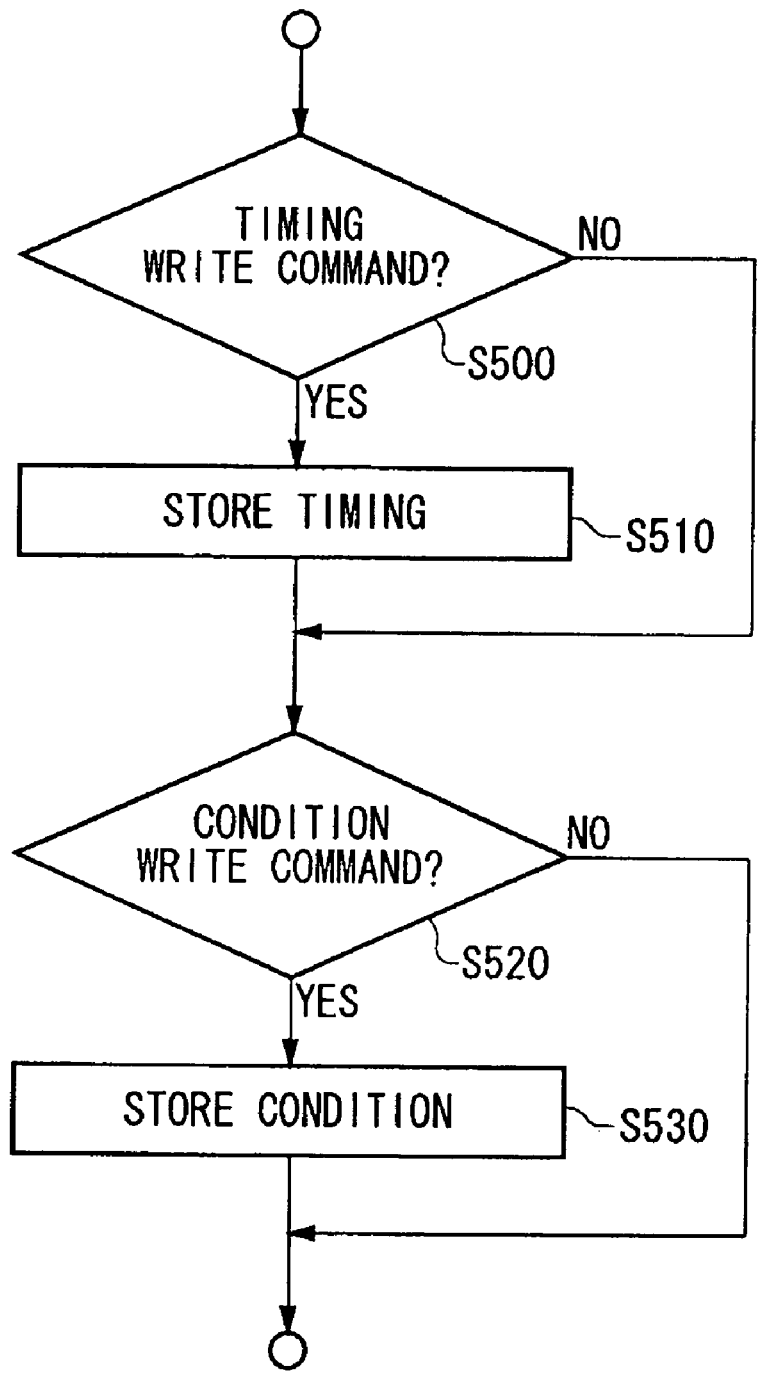
FIG. 5 shows a processing in S420 of FIG. 4 in detail.

FIG. 5 shows a processing in S420 of FIG. 4 in detail. The writing section 310 determines whether the fetched command is a timing write command (S500). If the fetch command is a timing write command (S500:YES), the writing section 310 causes the timing storage section 210 to store the timing designated by the timing write command (S510). If the fetched command is a condition write command (S520:YES), the writing section 310 causes the condition storage section 220 to store the condition of transmitting the subsequent control instructions, i.e. the address and the expected value of the status register (S530).

Figure 6:
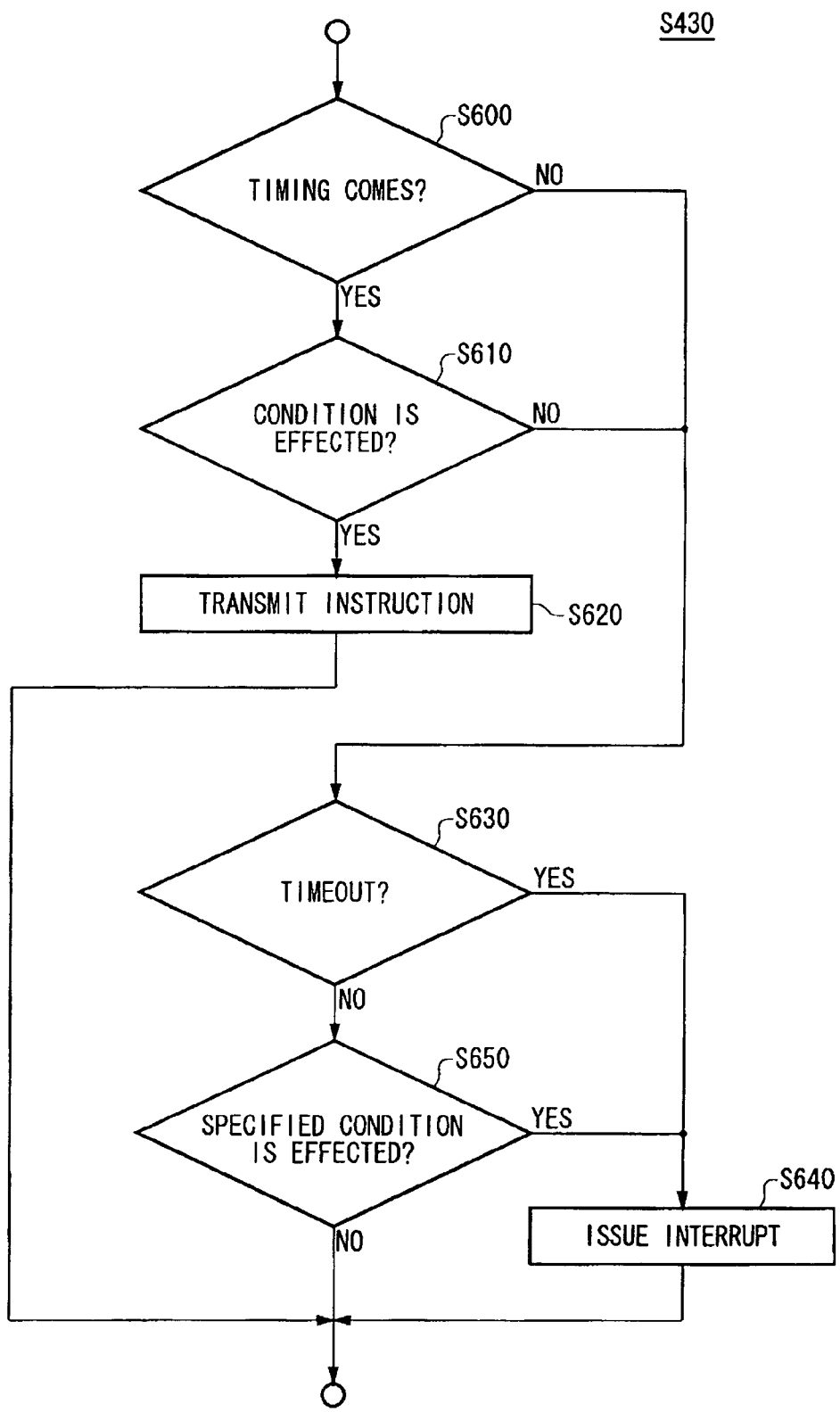
FIG. 6 shows a processing in S430 of FIG. 4 in detail.

FIG. 6 shows a processing in S430 of FIG. 4 in detail. The detecting section 320 detects a coming of the timing stored on the timing storage section 210 (S600). When the coming of the timing is detected, or if any timing is not originally set (S600:YES), the detecting section 320 determines whether the value of the status register becomes the expected value designated by the control processor 15 (S610). In the determination, the value of the status register may be used to determine after being bitmasked with a predetermined mask value as follows:

Firstly, in writing the address and the expected value of the status register, the control processor 15 writes a mask value to designate whether each bit of the value of the status register read by the polling section 230 is masked, and post-masked expected value indicative of the value which should be satisfied by the vale of the masked status register as the expected value. Then, the polling section 230 reads the value of the status register and determines whether the value obtained by masking the value of the status register with the mask value becomes the post-masked expected value. Then, in response to that a coming of the timing is detected and the value of the status register becomes the expected value (S600:YES), the detecting section 320 of the buffer control unit 35 transmits the control instruction write command received after the condition write command or the timing write command to the test unit 40 (S620). Here, if the mask value is set to the status register, it becomes the condition that the masked value becomes the post-masked expected value.

If any coming of the timing is not detected and the value of the status register does not become the expected value, the processing control section 30 determines whether a predetermined set timeout time lapses after the condition write command is acquired from the buffer section 200 (S630). If it lapses (S630:Yes), the processing control section 30 issues a timeout interrupt to the control processor 15 (S640). Thereby even if the set condition can not be effected because of occurring any accident and also even if the condition can not be effected because of any error of the set condition, it is possible to detect the error and appropriately start the next test.

Receiving the interrupt, the control processor 15 may issue an instruction to delete the content of the buffer section 200 to the relay section 20 in order to delete the content of the buffer section 200 and correctly start the next processing. In this case, receiving the instruction, the relay section 20 deletes the write command in the buffer section 200 instead of buffering the write command in the buffer section 200. Further for another example, the control processor 15 may issue an instruction to read the content of the buffer section 200 to the relay section 20. In this case, receiving the instruction, the relay section 20 does not buffer the instruction in the buffer section 200 but reads the write command from the buffer section 200 and transmits the same to the control processor 15. By implementing those mechanism, it can be more efficient to recover after occurring any error and find the causes.

The processing control section 30 determines whether a predetermined condition is effected, for example, whether the value of a predetermined specific status register becomes the expected value (S650). The state that the status register becomes the expected value is a state indicating that a series of tests by the test apparatus 10 is completed. In this case (S650:YES), the processing control section 30 issues an interrupt to the control processor 15 in order to transmit the subsequent control instructions, i.e. the control instruction of the next test from the control processor 15 (S640).

Figure 7:
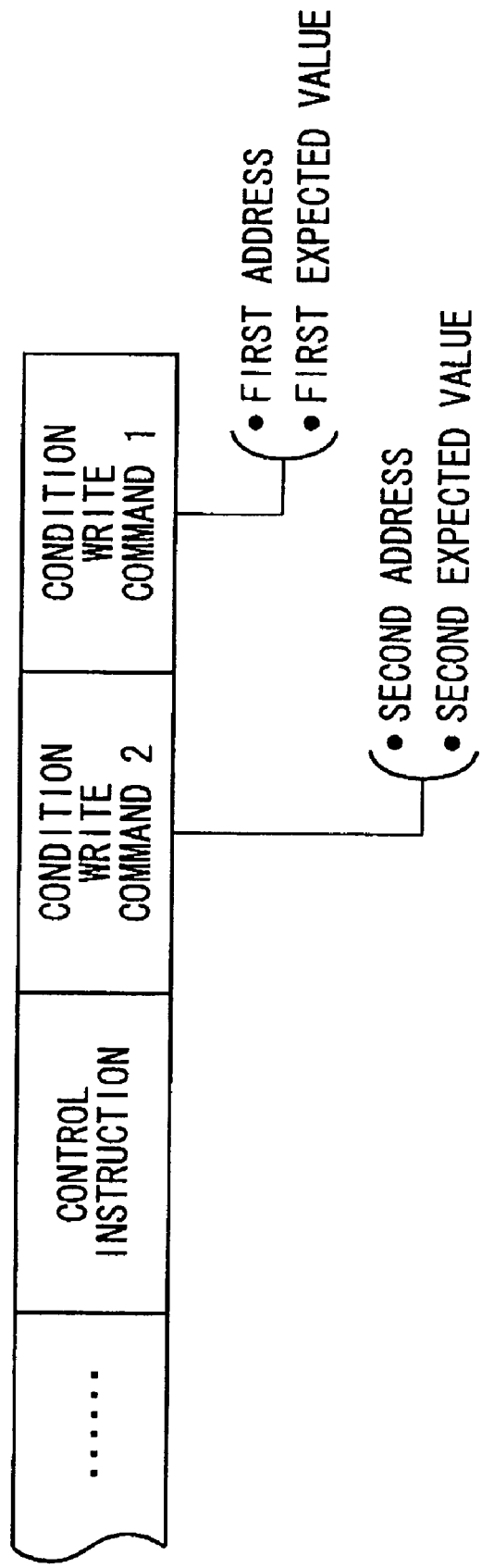
FIG. 7 shows a first example of instructions buffered by a buffer section 200.

FIG. 7 shows a first example of instructions buffered in a buffer section 200. An example that a plurality of conditions to be satisfied to execute a control instruction are set will be described by using the first example. As for the first example, the FIFO buffer section 200 stores a condition write command 1 to write the condition to the status register 400, a condition write command 2 to write the condition to the status register 410 and a control instruction to control the test unit 40. The condition write command 1 includes a first address to identify the status register 400 in the address space of the control processor 15 and a first expected value to be compared with the status register 400. The condition write command 2 includes a second address to identify the status register 410 in the address space of the control processor 15 and a second expected value to be compared with the status register 410.

That is to say, intending to transmit the control instruction to the test register 400, the control processor 15 sequentially writes the address of the status register 400 and the first expected value and the address of the status register 410 and the second expected value to the addresses assigned to the buffer section 200 provided that the status register 400 becomes the first expected value and the status register 410 becomes the second expected value. Then, the control processor 15 writes the control instruction to the addresses assigned to the test unit 40. Therefore, the condition write command 1, the condition write command 2 and the control instruction are sequentially stored in the buffer section 200. In the case that the buffer 200 is in the state, the polling section 230 repeatedly issues a first read command with a read address being the address of the status address 400 to the test unit 40 in response to that the address of the status register 400 and the condition write command 1 to write a first evaluated value are acquired from the buffer 200. Then, the buffer controlling section 35 fetches the address of the status register 410 and the condition write command 2 to write a second expected value, which are received after the condition write command 1 from the buffer section 200 in response to that the value of the status register 400 becomes the first expected value. Then, the polling section 230 repeatedly issues a second read command with a read address being the address of the status register 410 to the test unit 40 in response to that the condition write command 2 is acquired from the buffer 300. Then, the buffer controlling section 35 transmits a control instruction write command received after the condition write command 2 to the test unit 40 in response to that the value of the status register 410 becomes the second expected value. Thus, by using a plurality of condition write commands, a plurality of conditions which satisfies to execute the control instruction can be designated.

Figure 8:
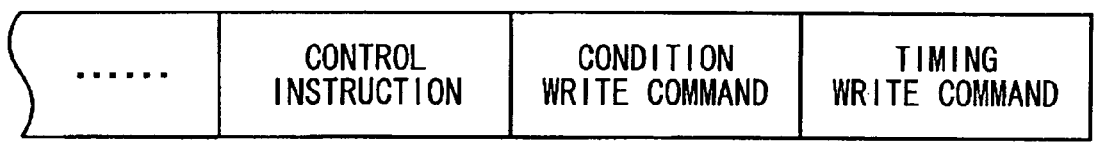
FIG. 8 shows a second example of instructions buffered by a buffer section 200.

FIG. 8 shows a second example of instruction group buffered in the buffer section 200. An example that a plurality of conditions to be satisfied to execute a control instruction are set will be described by using the second example. In the second example, the FIFO buffer section 200 stores a timing write command to define the a timing at which the control instruction should be transmitted to the test unit 40, a condition write command to write the condition to the status register 400 and a control instruction to control the test unit 40 sequentially from the head.

That is to say, the control processor 15 sequentially issues the timing write command, the condition write command and control instruction command in the described order. In such state, the detecting section 320 detects a coming of the timing written by the timing write command. Detecting the coming of the timing, the fetch section 300 fetches the next command, i.e. the condition write command from the buffer section 200. Then, the polling section 230 repeatedly issues a read command with a read address being the address of the status register 400 to the test unit 40 in response to that the address of the status register 400 and the condition write command to write the expected value are acquired from the buffer section 200. Then, the buffer control unit 35 transmits the control instruction write command which received after the condition write command to the test unit 40 in response to that the value of the status register 400 becomes the expected value. Thus, the condition which satisfies to execute the control instruction may be a combination of a plurality of conditions.

Figure 9:
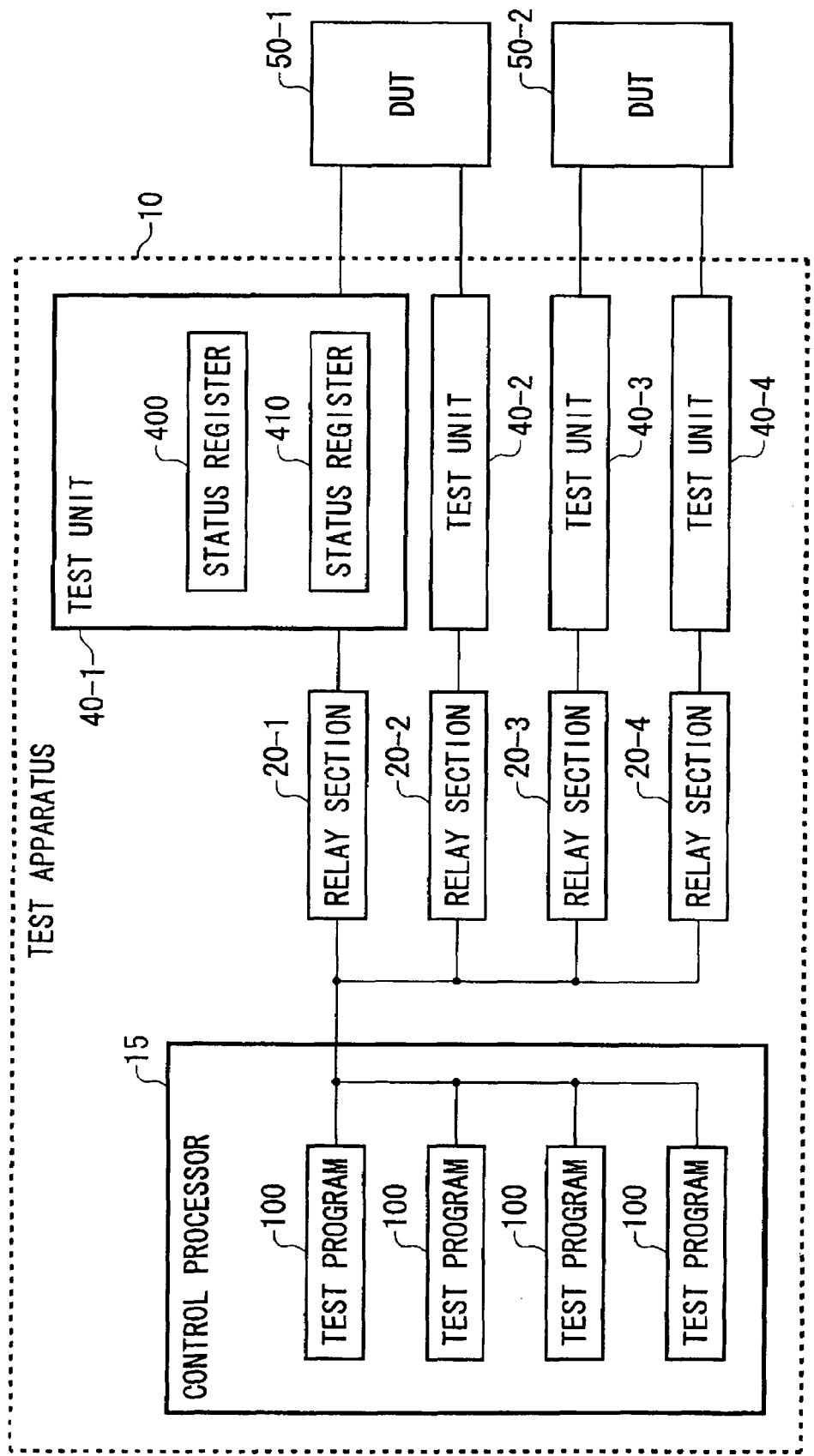
FIG. 9 shows a whole configuration of the test apparatus 10 according to a modification of the present embodiment.

FIG. 9 shows the whole configuration of the test apparatus 10 according to the modification of the present embodiment. The modification intends to test a single device under test 50 by cooperating a plurality of test units 40 each other. Along with offering technical advantages of the device under test 50, the number of the input-output terminals thereof is increased, so that one test unit 40 may be not enough to test one device under test 50. In such case, each of the plurality of test units 40 is connected to one input-output terminal to test the device under test 50.

Specifically, according to the test apparatus of the modification, a device under test 50-1 is tested by a test unit 40-1 and a test unit 50-1. Additionally, the test apparatus 10 tests a device under test 50-2 by a test unit 40-3 and a test unit 40-4. Each relay section 20-1-20-4 is provided for each of the test units 40-1-40-4. In such configuration, the relay section 20-1-20-2 may share the same address space in the control processor 15. Additionally, the relay sections 20-3-20-4 may share the same address space in the control processor. Now, an example of instruction relay processing in such case will be described with reference to FIG. 10.

Here the configuration except for that described in FIG. 9 is the same as that of the test apparatus 10 according to the present embodiment described with reference to FIG. 1-FIG. 8, so that the description is omitted.

Figure 10:
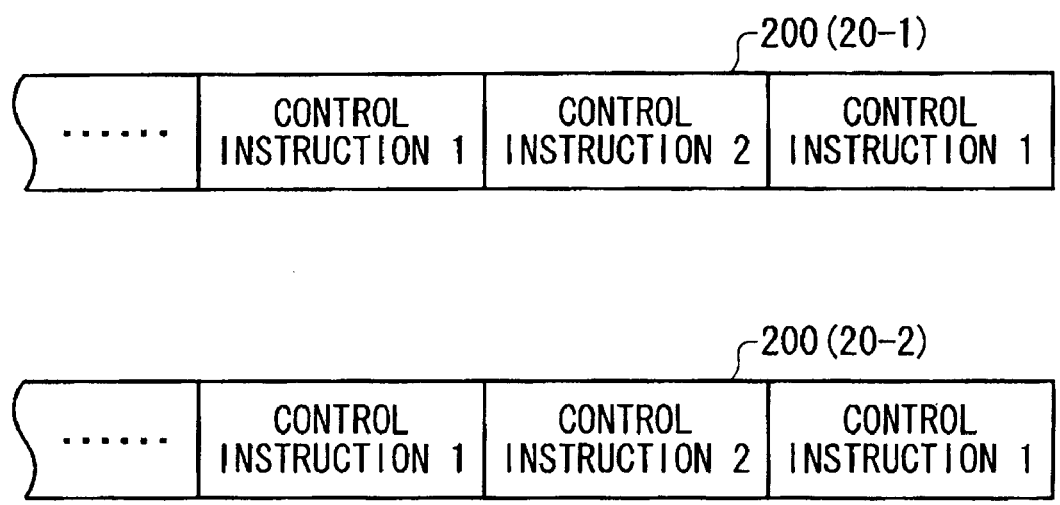
FIG. 10 shows an example of instructions buffered by the buffer section 200 according to a modification of the present embodiment.

FIG. 10 shows an example of instruction groups buffered in the buffer section 200 according to the modification of the present embodiment. Since the relay section 20-1 and the relay section 20-2 share the same address space, the same instruction group is buffered in the buffer section 200 of the relay section 20-1 and the buffer section 200 of the relay section 20-2. Specifically, a control instruction 1 for the test unit 40-1, a control instruction 2 for the test unit 40-2 and the control instruction 1 for the test unit 40-1 are sequentially stored in each of the buffer section 200 in the described order from the head. Fetching the control instruction 1 from the head of the buffer section 200, the fetch section 300 of the relay section 20-1 judges whether the writing destination of the control instruction 1 is the test unit 40-1. Since the writing destination is the test unit 40-1, the relay section 20-1 transmits the control instruction 1 to the test unit 40-1. Meanwhile, since the writing destination of the control instruction at the head of the buffer section 200 is not the test unit 40-2, the fetch section 300 of the relay section 20-2 does not execute the control instruction 1 but cancels the same. After the control instruction 20-1 at the head is completely executed or cancelled, both of relay sections 20-1 and 20-2 shift to process the next instructions. That is to say, fetching the control instruction 2, the buffer section 200 of the relay section 20-1 transmits the same to the test unit 40-2 because the writing destination of the control instruction 2 is the test unit 40-2. Meanwhile, the buffer section 200 transmits the control instruction 2 to the test unit 40-2 because the writing destination of the control instruction 2 is the test unit 40-2. In the same way, the following control instructions are transmitted.

Thus, according to the modification, the address space viewed from the control processor 15 can be set to each device under test 50 even if the case that one device under test 50 is tested by using a plurality of test units 40. Thereby the instruction for each of the test units 40 can be appropriately assigned to the test unit 40 and processed. Thus, according to the modification, the relay section 20 can also assign the instructions in addition to the processing in the embodiments described with reference to FIG. 1-FIG. 8, so that the load of the control processor 15 can be reduced. Further, according to the modification, the existing test program 10 and test 40 can be easily applied thereto.

While the present invention has been described with the embodiment, the technical scope of the invention not limited to the above described embodiment. It is apparent to persons skilled in the art that various alternations and improvements can be added to the above-described embodiment.

For example, each relay section 20 indicated in the embodiment or the modification may be included in the corresponding test unit 40. It is apparent from the scope of the claims that the embodiment added such alternation or improvements can be included in the technical scope of the invention.

As described above, according to the embodiment (s), the test apparatus and the control method which accurately and efficiently control the operation timing of the test unit can be achieved.

What is claimed is:

1. A test apparatus that tests a device under test, comprising:
    a control processor that executes a test program to test the device under test;
    a test unit connected to the device under test that tests the device under test according to an instruction of the control processor; and
    a relay section connected to the control processor and the test unit that relays a control instruction transmitted from the control processor to the test unit,
    wherein the relay section includes:
        a buffer section that buffers the control instruction to be written to an address assigned from the control processor to the test unit;
        a timing storage section that stores a timing at which the control instruction should be transmitted to the test unit, the timing being designated by a command received from the control processor; and
        a buffer control unit that detects that the timing stored in the timing storage section comes and transmits the control instruction buffered by the buffer section to the test unit in response to detecting that the timing comes,
    wherein
        the control processor writes the timing at which the control instruction should be transmitted to the test unit to the address assigned to the relay section before writing the control instruction,
        the buffer section sequentially buffers a timing write command to write the timing and a control instruction write command to write the control instruction, which are received from the control processor and
        the buffer control unit delays processing the control instruction write command received after the timing write command until the timing comes in response to that the timing write command is fetched from the buffer section.

2. The test apparatus as set forth in claim 1, wherein the buffer control unit including:
    a fetch section that sequentially fetches the write commands buffered in the buffer section;
    a timing write section that causes the timing storage section to store the timing in response to that the timing write command is fetched;
    a detecting section tat detects a coming of the timing stored in the timing storage section; and
    a transmitting section that transmits the control instruction write command received after the timing write command to the test unit provided that the coming of the timing is detected.

3. The test apparatus as set forth in claim 2, wherein each of a plurality of the test units is provided for each of a plurality of the device under tests, and each of a plurality of relay sections is provided for each of a plurality of test units.

4. A control method that controls a test apparatus including a control processor that executes a test program to test a device under test and a test unit connected to the device under test that tests the device under test according to the instruction by the control processor, comprising:
    buffering a control instruction to be written to an address assigned from the control processor to the test unit;
    storing a timing at which the control instruction should be transmitted to the test unit, the timing being designated by a command received from the control processor;
    detecting that the timing stored in the timing storage section comes; and
    transmitting the buffered control instruction to the test unit in response to that the timing comes,
    wherein the control processor writes the timing at which the control instruction should be transmitted to the test unit to the address assigned to the relay section before writing the control instruction.

the buffer section sequentially buffers a timing write command to write the timing and a control instruction write command to write the control instruction, which are received from the control processor and the buffer control unit delays processing the control instruction write command received after the timing write command until the timing comes in response to that the timing write command is fetched from the buffer section.

\* \* \* \* \*